United States Patent [19]

Espenshade et al.

[11] Patent Number: 5,290,192

[45] Date of Patent: Mar. 1, 1994

[54] CHIP CARRIER SOCKET

[75] Inventors: Leonard K. Espenshade, Harrisburg; Richard L. Marks, Mechanicsburg; Donald W. Milbrand, Jr., Mechanicsburg; Mark J. Zitto, Mechanicsburg, all of Pa.

[73] Assignee: Wells Electronics, Inc., South Bend, Ind.

[21] Appl. No.: 951,795

[22] Filed: Sep. 28, 1992

[51] Int. Cl.⁵ .................................. H01R 11/22
[52] U.S. Cl. ........................ 439/266; 439/70; 439/331
[58] Field of Search .............. 439/68, 72, 73, 259, 439/261–266, 268–270, 330, 331

[56] References Cited

U.S. PATENT DOCUMENTS

| | | | |
|---|---|---|---|
| 4,435,724 | 3/1984 | Ralstin | 357/79 |
| 4,691,975 | 9/1987 | Fukunaga et al. | 439/266 |
| 4,993,955 | 2/1991 | Sovant | 439/73 |
| 5,020,998 | 6/1991 | Ikeya et al. | 439/266 |
| 5,139,437 | 8/1992 | Ikeya et al. | 439/266 |

*Primary Examiner*—Larry I. Schwartz
*Assistant Examiner*—Hien D. Vu
*Attorney, Agent, or Firm*—James D. Hall

[57] ABSTRACT

A socket for securing an integrated circuit (IC) during burn-in or test procedures. The socket includes a base which carries a plurality of electrically conductive contacts. Opposed hold down rollers are shiftably journaled in the base. The socket also includes a movable top connected to the base and a contact with the rollers. Movement of the top shifts the rollers between secured and open positions. A rotatable lever housed in the base is connected to an actuating arm which is also shiftable by movement of the top. The lever is operably associated with the contacts and shifts the contacts between an operative position in contact with the IC chip leads and a standby position spaced from the IC chip leads.

4 Claims, 3 Drawing Sheets

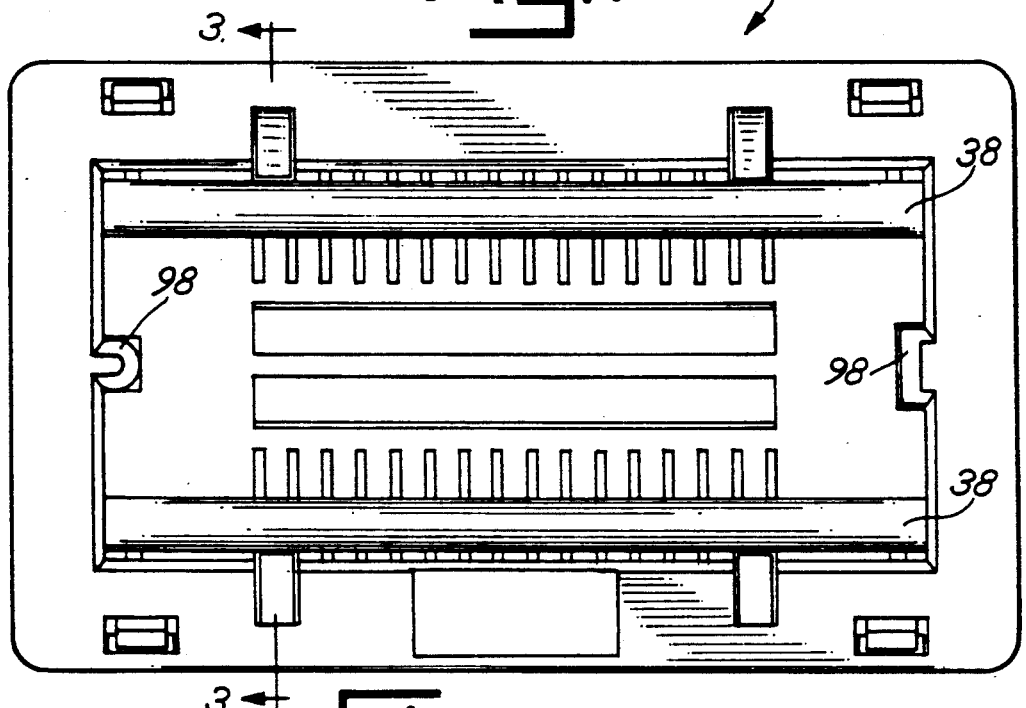
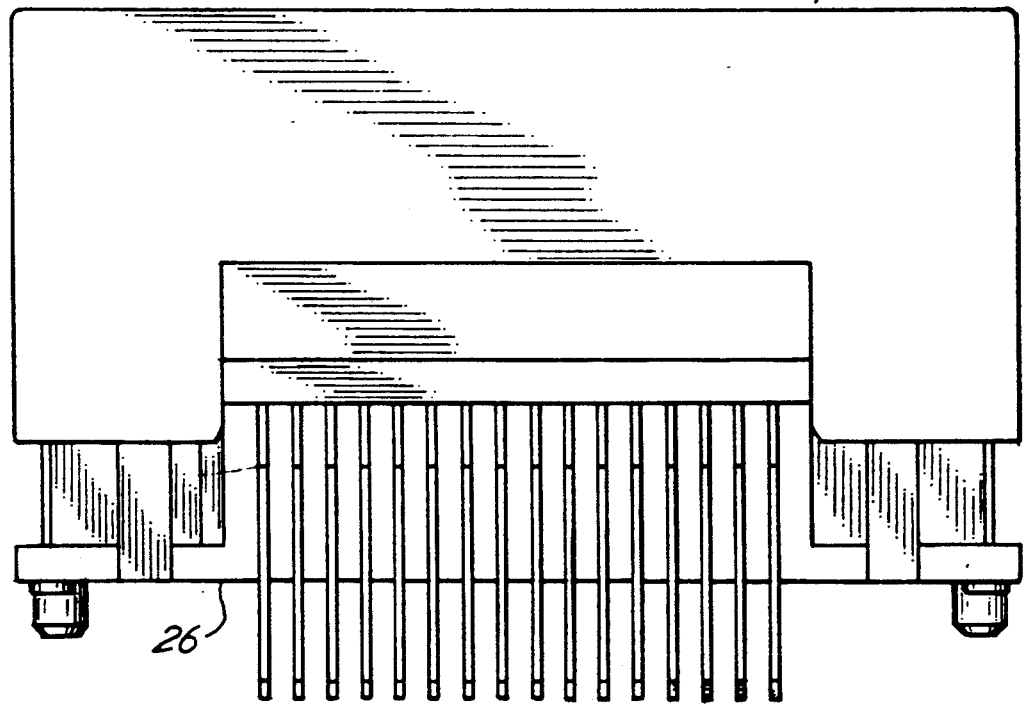

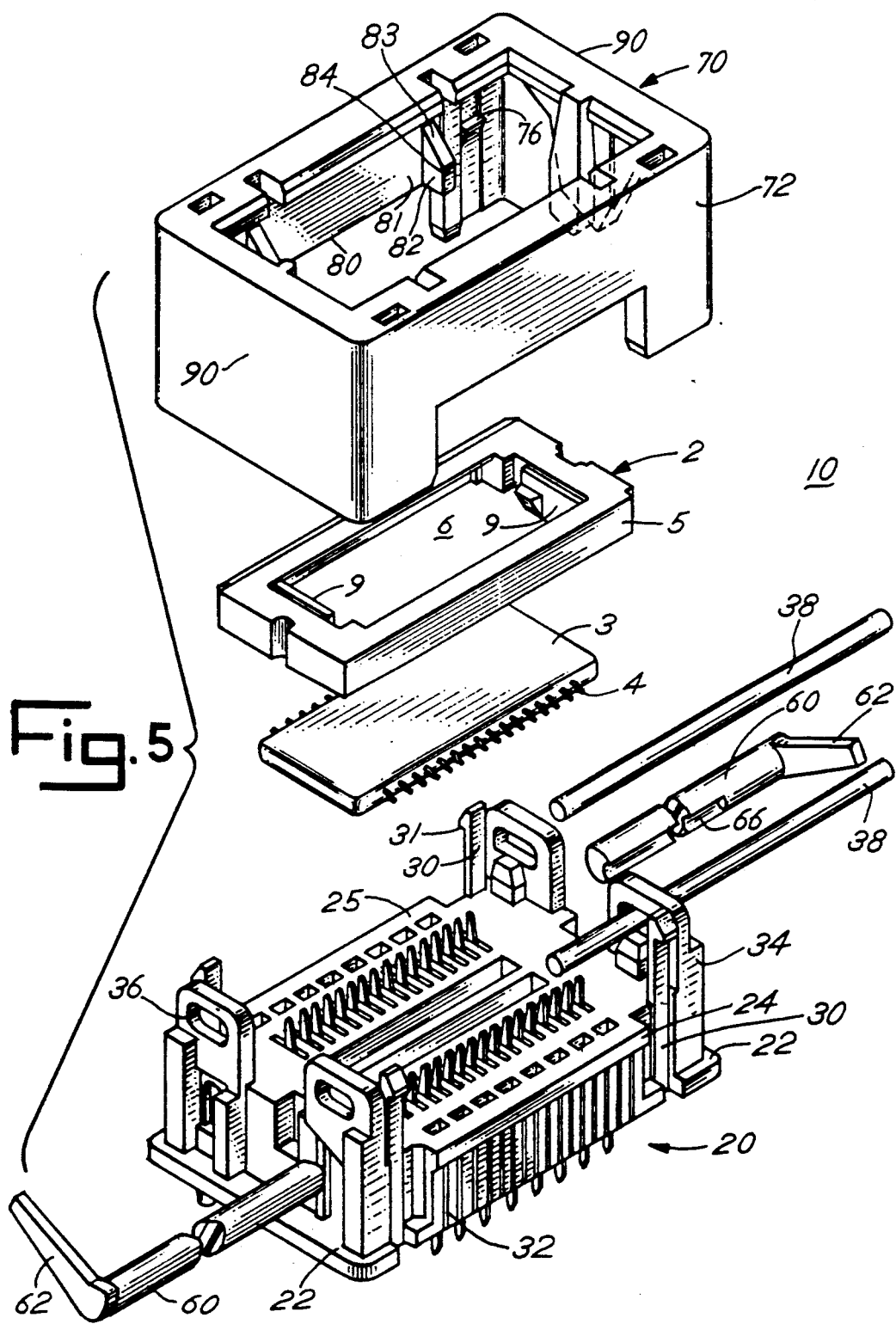

CHIP CARRIER SOCKET

FIELD OF THE INVENTION

This invention relates to sockets for integrated circuit chip carriers and will have special application to burn-in or test sockets.

BACKGROUND OF THE INVENTION

An integrated circuit package contain an integrated circuit (IC) in the form of a wafer or chip, and electrically conductive leads or pads extend from the chip. IC chips are generally mounted in carriers for test purposes and for protection of the leads.

As is well known in the art, IC carriers are often subjected to rigorous testing to ensure their stability and usefulness. Various IC carrier sockets have been developed for IC testing and burn-in procedures. Most of the development in IC carrier sockets has centered on providing zero insertion force (ZIF) characteristic in socket design as shown in U.S. Pat. Nos. 4,491,377; 4,623,208; and 4,715,823, and in my U.S. Pat. Nos. 5,114,358 granted May 19, 1992 and 5,205,756 granted Apr. 27, 1993.

In all the prior art devices identified above, flexible cantilevered contacts are spaced apart by some engagement of the contacts directly with some portion of a movable socket housing to allow introduction of the IC carrier into the socket with zero force exerted on the IC chip leads from the socket contacts. The IC carrier merely rests inside the socket until movement of the socket housing releases the contacts to engage the IC chip leads.

Inherent play in the movement of the base housing members creates functional and operational problems. Unbalanced tensioning of the contacts against the IC chip leads can result in a weak or failed electrical connection. The carrier itself may shift or even dislodge from the socket.

SUMMARY OF THE INVENTION

The socket of this invention includes a pair of rollers which hold the IC carrier against a base platform. The rollers move apart when a biased top is depressed downward to allow the IC carrier to be placed in the socket. The downward depression of the top also operates a cammed lever housed inside the base platform which retracts the contacts away from the IC carrier during insertion. The top includes side projections which contact the rollers and effect shift the rollers along the end faces of the socket wall between a secured and open positions. The top also includes end projections which contact a cammed actuating lever to effectively retract the contact heads. Releasing the biased top moves the rollers over the top of the IC carrier and then moves the contact heads upward into engagement against the IC chip leads.

Accordingly, it is an object of this invention to provide for a novel and improved chip carrier socket.

Another object is to provide for a ZIF IC carrier socket which provides for cammed lever to spread the contacts to permit IC carrier insertion and removal.

Another object is to provide rollers for securing the IC carrier within the socket as the contacts engage the chip leads.

Other objects will become apparent upon a reading of the following description.

BRIEF DESCRIPTION OF THE DRAWINGS

A preferred embodiment of the invention has been depicted for illustrative purposes only wherein:

FIG. 1 is a top plan view of the socket of this invention.

FIG. 2 is a side elevation view of the socket.

FIG. 5 is an exploded perspective view of the major components of the socket.

DESCRIPTION OF THE PREFERRED EMBODIMENT

The preferred embodiment herein described is not intended to be exhaustive or to limit the invention to the precise form disclosed. It is chosen and described to illustrate the principles of the invention and its application and practical use to allow others skilled in the art to follow its teachings.

Figure 3:
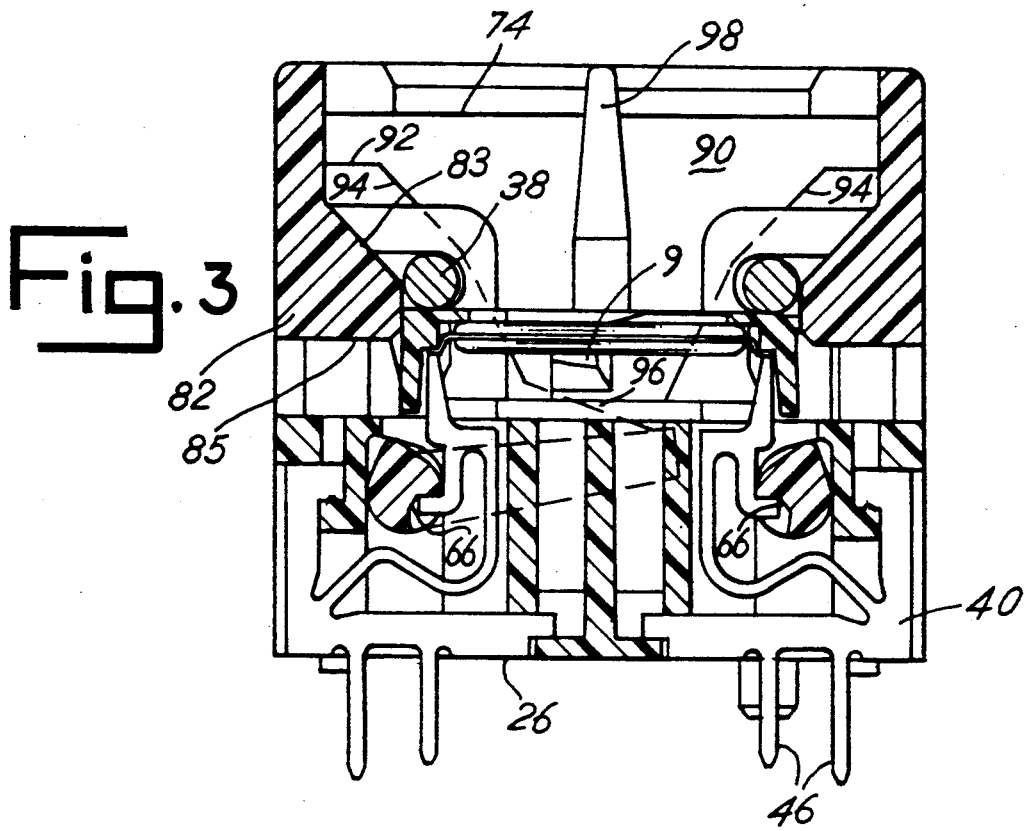
FIG. 3 is a sectional view taken along line 3—3 of FIG. 1, showing the carrier inserted into the socket in a closed position.
Figure 4:
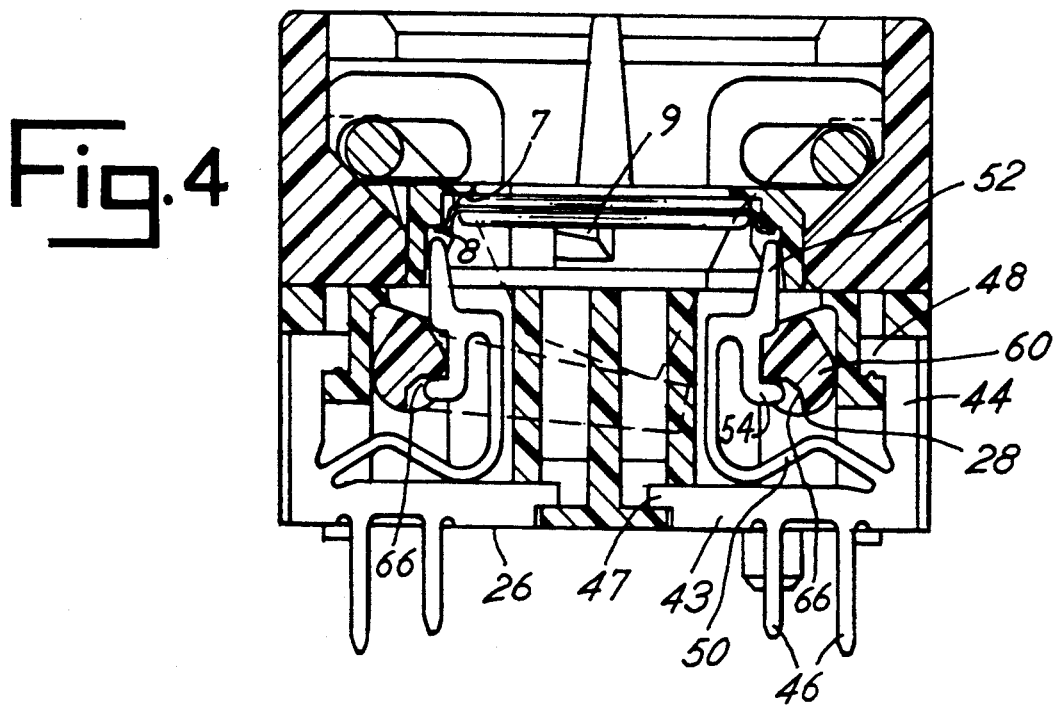
FIG. 4 is a sectional view taken along line 3—3 of FIG. 1, showing the carrier inserted into the socket in an open position.

As shown in FIGS. 3-5, socket 10 is used to house IC carrier 2 which supports IC chip 3. In the embodiment shown, IC chip 3 has a generally rectangular configuration with leads 4 extending from opposite sides of IC chip 3, but socket 10 may be modified to accommodate other sizes, shapes and lead configurations of IC chips and IC carriers. IC chip 3 is preferably secured for testing or burn-in to IC carrier 2. IC carrier 2 as shown includes a generally rectangular frame 5 defining a central opening 6. Frame 5 defines stepped shoulders 7 and 8 and integral latch arms 9 which secure IC chip 3 to IC carrier 2 in a snap-fit fashion as shown in FIGS. 3 and 4. When secured, the body of IC chip 3 abuts against shoulder 7 and leads 4 abut against shoulder 8.

Socket 10 includes a non-conductive base member 20, preferably of a one-piece molded construction. Base 20 has peripheral end located rims 22 and an upraised table 24. Table 24 has two bores 28 defined along the longitudinal axis of table 24 on each end near opposed corners. Each corner of table 24 has an upright column 34 extending above top face 25. An ovalized horizontal aperture 36 extends through each column 34. Rollers 38 are journaled through apertures 36 of opposed columns 34 traversing the length of table 24. Rollers 38 partially overhang beyond column 34 and move within the aperture 36. Base member 20 also includes two pairs of opposed finger latches 30 extending upward from rim 22. Each finger latch 30 is flexible and includes a lock tab 31.

A plurality of grooves 32 are defined in table 24. Grooves 32 are shown oriented in a transverse orientation from side-to-side but their orientation is a matter of design dictated by the configuration of IC chip 3. In the embodiment shown, there are thirty-two grooves 32 defined in table 24, sixteen on either side of the table. Grooves 32 extend downward through bottom face 26 and upward through top face 25.

Grooves 32 accommodate a plurality of electrically conductive contacts 40. Generally, each contact 40 is snugly press fit into grooves 32 of base member 20. Each contact 40 is constructed of a resilient electrically conductive material. Each contact 40 has the general cross-sectional configuration shown in FIGS. 3 and 4. Each contact 40 has a generally L-shaped base defined by lower leg 43 and upright stem 44. Feet 46 extend from leg 43 down beneath the lowermost edge of base 20 and provide for connection to a test or burn-in board (not shown). Each contact leg 43 includes a terminal lip 47 and each stem 44 includes terminal lip 48 which allows each contact 40 to be firmly secured to base 20. Each contact 40 also includes a curved neck 50 terminating in an integral upper contact head 52 and a downwardly extending integral beam 54. Contact head 52 extends partially above top face 25. Beam 54 as shown is generally L-shaped and interrupts bore 28 inside table 24.

Bores 28 rotatably house actuator rods 60. Each actuator rod 60 has an exposed actuating lever 62 located at an end of table 24. Rod 60 has a longitudinal edge forming groove 66 extending a partial length of rod 60 with the general cross-sectional configuration shown best in FIG. 5. Beams 54 of contact 40 interrupt bore 28 to engage rods 60 inside grooves 66. For design purposes, two bores 28 and two rods 60 are provided in the embodiment shown, one along each side of table 24 to ensure simultaneous action of rods 60.

Socket 10 includes movable top or actuator 70 which is shiftably connected to base member 20 having the general configuration best shown in FIG. 5. Top 70 includes a generally rectangular frame 72 which defines central opening 74 to allow for the insertion of an IC carrier with an IC chip into socket 10. Top 70 is movably secured to base 20 by side walls 80 of frame 72 having an interiorly located latch shoulder 76, of which there are four. The engagement of finger latches 30 and shoulders 76 limit the upward movement of top 70. As shown in FIGS. 3–5, each side wall 80 of frame 72 has an inner surface 81 with two angular side projections 82. Side projections 82 have inclined faces 83, side face 84 and lower shoulders 85. Lower shoulders 85 abut table 24 to limit the downward movement of top 70.

As shown in FIGS. 3–5, end walls 90 of frame 72 have an inner surface which define an end projection 92 with two slant shoulders 94. The overhang of rollers 38 contact projections 92 along slant shoulders 94. Rollers 38 are journaled between slant shoulders 94 of end projection 92 and side and slant faces 84 and 83 of side projection 82. Slant shoulders 94 converge to form actuator shoulder 96. Each end projection 92 also includes vertical guides 98 for accommodating IC carrier 2 and acting to orient IC carrier 2 inside socket 10. It will be seen in FIG. 1 that, for purposes of illustration in the embodiment shown, one of guides 98 is generally circular in cross-section and the other is rectangular. The configuration prevents improper insertion of IC carrier 2 into socket 10.

Socket 10 functions to test or burn-in IC chips as shown in FIGS. 3–4. The description below will sequentially describe the process of removing the IC chip 3 from socket 10, and the insertion of another IC chip 3. In the case described, IC chip 3 is housed in IC carrier 2. Socket 10 operates as follows:

FIG. 3 illustrates socket 10 with top 70 in a full up position, with IC carrier 2 secured therein by rollers 38. The top 70 is normally urged apart from base 20 by the preloaded tension of curved necks 50 of contacts 40. In this position, rollers 38 are positioned by side projection 82 to overlie carrier frame 5 and contact heads 52 bear against IC chip leads 4 to both firmly secure chip 3 in socket 10 and to provide electrical connection through contact legs 46 to a testing or burn-in board (not shown).

FIG. 4 shows socket 10 in an open position with top 70 depressed against base member 20. Top 70 is depressed toward base 20 either manually or by a machine. Depressing top 70 urges actuator shoulders 96 of end projections 92 to push on actuator lever 62, As top 70 continues its downward movement, lever 62 and connected rod 60 rotate counterclockwise. Grooves 66 bear against beam 54 of each contact 40. The rotation of rod 60 creates a cam action with grooves 66 acting on beam 54 of contacts 40. The cam action forces contact head 52 downward into grooves 32 in top face 25. When top 70 is depressed fully, contact heads 52 are spaced from IC chip leads 4 to break the electrical connection between IC chip 3 and contact heads 52. The retraction of contact heads 52 allows IC carrier 2 to be inserted into or removed from socket 10 without contact heads 52 engaging IC chip leads 4. This action provides the desirable zero insertion force characteristic in socket 10.

Depressing top 70 also urges slant shoulder 94 of end projection 92 against the overhanging portion of rollers 38. The downward movement of top 70 forces rollers 38 outward along slant shoulder 94 towards the outermost ends of apertures 36. In the fully depressed position, rollers 38 are spaced completely away from central opening 74 to allow IC carrier 2 to be inserted or removed.

Releasing top 70 returns socket 10 to a closed position. Tension from the flexed curved necks 50 of contacts 40 rotates rods 60 and end arms 62. Rotation of end arm 62 urges abutment part 96 upward thereby raising top 70 away from base member 20. The rotation of rod 60 also releases contact heads 52 to extend upward towards conductive engagement with IC chip leads 4. As top 70 moves upward, side projections 82 force rollers 38 inward along slant face 83 towards the innermost ends of apertures 36. In the full up position, rollers 38 are held over carrier frame 5 by side face 84.

It should be noted that any number of configurations are possible for socket 10 and the arrangement of contacts 40 in base member 20. Individually engineered sockets will depend upon the size and configuration of the particular IC chips, carriers and the number and type of leads. Other individual engineering details may be necessary, depending again upon the type of IC chip or leads and these details are contemplated as part of this invention. The details above given are for illustrative purposes only and the scope of this invention is not to be limited to those details. The scope of this invention may be defined instead by reference to the following claims.

We claim:

1. A socket for housing an integrated circuit having a body and a plurality of outwardly extending leads said socket comprising a base, a plurality of resilient electrically conductive contacts for retractable engagement with said leads, each contact retained in said base, a top movably connected to said base and having a central opening therein for insertion of said integrated circuit, a pair of elongated rollers for shiftably securing a carrier to said socket, said top coacting with said rollers for shifting said rollers between a normally secured position wherein said rollers overlie said body to secure said integrated circuit in place and an unsecured position to allow said integrated circuit to be removed or inserted, actuator means engaging said contacts, said top coacting with said actuator means for causing the actuator means to shift said contacts between a first position contacting said leads and a second position spaced from said leads.

2. The socket of claim 1 wherein each contact includes an upper cantilevered beam, said actuator means includes a rod rotatably housed within said base and having a longitudinal groove receiving each said beam, and a lever connected to said rod, said top contacting said lever as said top is moved toward said base, whereby rotation of said rod presses against said beam to shift said contacts into said second position.

3. The socket of claim 1 wherein said base having an ovalized aperture therein for shiftably journaling each roller, said top having an interior inclined projection and an interior inclined end shoulder contacting each roller, so that downward movement of said top urges said end shoulder against said roller to laterally shift said roller outward to said open position and upward movement of said top urges said inclined projection against said roller to laterally shift said roller inward to said secured position.

4. The socket of claim 1 wherein said integrated circuit is housed in said carrier, said roller overlying and securing said carrier when in said secured position.

* * * * *